United States Patent
Gramann et al.

(10) Patent No.: US 7,329,560 B2
(45) Date of Patent: Feb. 12, 2008

(54) METHOD FOR ENCAPSULATING AT LEAST ONE ORGANIC LIGHT-EMITTING (OLED) DEVICE AND OLED DEVICE

(75) Inventors: Wolfgang Gramann, Regensburg (DE); Ewald Karl Michael Guenther, Regenstauf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 10 days.

(21) Appl. No.: 11/268,338

(22) Filed: Nov. 7, 2005

(65) Prior Publication Data

US 2006/0128042 A1 Jun. 15, 2006

Related U.S. Application Data

(60) Provisional application No. 60/634,901, filed on Dec. 10, 2004.

(51) Int. Cl.
*H01L 51/56* (2006.01)

(52) U.S. Cl. .............. 438/99; 438/26; 257/E51.02

(58) Field of Classification Search .......... 438/26, 438/64, 40, 106, 121, 125; 257/E51, E23.181, 257/E23.128, E51.02, 704, 924, 431, 432, 257/433, 434, 435, 659
See application file for complete search history.

(56) References Cited

U.S. PATENT DOCUMENTS

| | | | |
|---|---|---|---|
| 5,225,935 A * | 7/1993 | Watanabe et al. | 359/619 |
| 5,677,749 A * | 10/1997 | Tsubota et al. | 349/160 |
| 2003/0207500 A1* | 11/2003 | Pichler et al. | 438/127 |
| 2003/0211644 A1* | 11/2003 | Boroson et al. | 438/26 |
| 2006/0050028 A1* | 3/2006 | Pasch et al. | 345/76 |

* cited by examiner

*Primary Examiner*—Bradley Baumeister
*Assistant Examiner*—Minchul Yang
(74) *Attorney, Agent, or Firm*—Cohen Pontani Lieberman & Pavane LLP

(57) ABSTRACT

A method for encapsulating at least one organic light-emitting (OLED) device is disclosed. The method includes the step of forming a concave region on a plate by applying a negative pressure to a predetermined area of the plate. The plate is attached to a substrate including at least one active region such that the concave region of the plate spans over the active region.

24 Claims, 2 Drawing Sheets

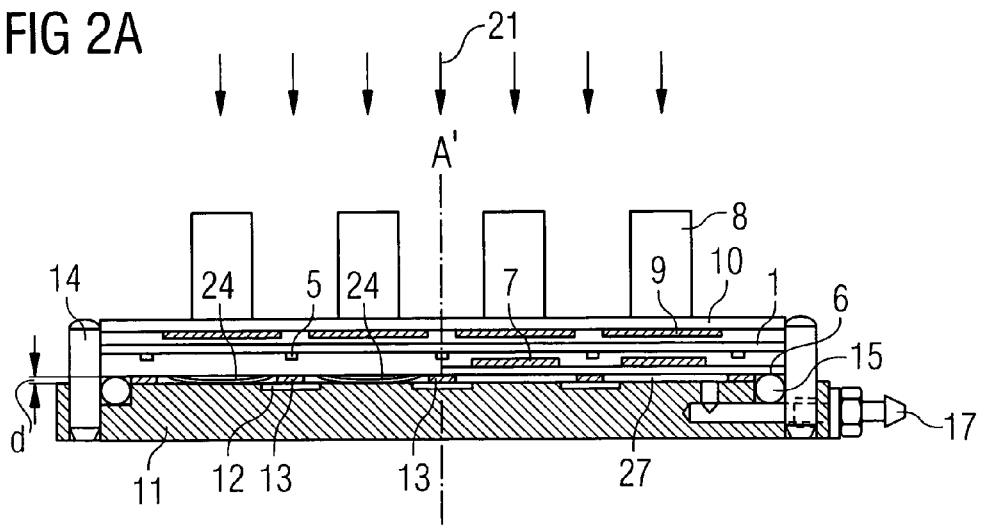
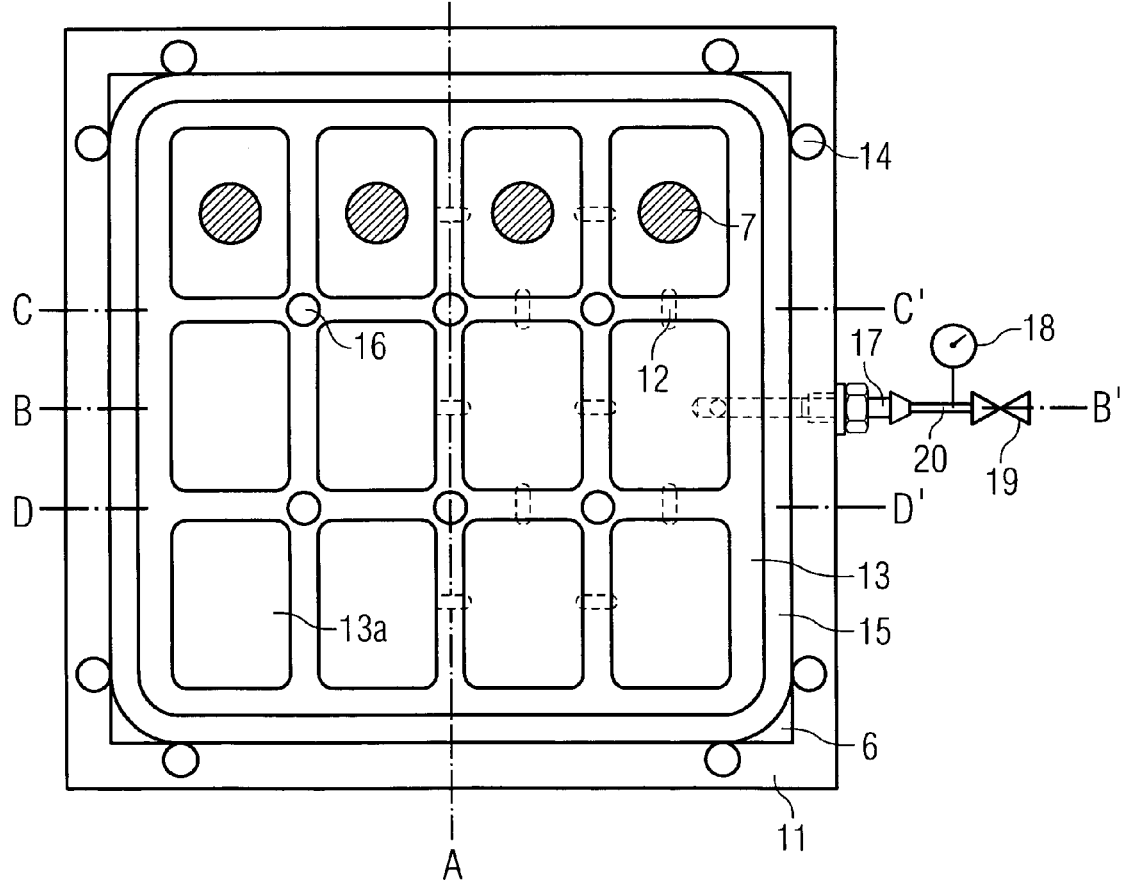

METHOD FOR ENCAPSULATING AT LEAST ONE ORGANIC LIGHT-EMITTING (OLED) DEVICE AND OLED DEVICE

RELATED APPLICATIONS

This application claims priority from U.S. Provisional Patent Application Ser. No. 60/634,901 which was filed on Dec. 10, 2004.

FIELD OF THE INVENTION

An OLED device comprises, for example, at least one active region which is applied to a substrate. The active region comprises, for example, a lower electrode, an upper electrode and at least one active layer sandwiched between lower and upper electrode. The active layer comprises an organic material.

When an electrical current is applied to the at least one active layer, electrons and holes are injected into the organic material via the lower and upper electrodes. The charge carriers recombine within the at least one active layer. The energy thereby released is emitted as electromagnetic radiation, for example in the visible range. Furthermore, it is possible to apply a plurality of such OLED devices to the substrate. Each of the OLED devices comprises at least one active region.

SUMMARY OF THE INVENTION

One object of the present invention is to provide an improved method for encapsulating an OLED device.

Another object of the present invention is to provide an OLED device with such an improved encapsulation.

According to one implementation of the method for encapsulating at least one OLED device, the method comprises the step of forming a concave region on a plate by applying a negative pressure to a predetermined area of the plate. That means that by locally applying a negative pressure to a plate a concave region of the plate is formed.

A plurality of concave regions can be formed on the plate by applying a negative pressure to a plurality of predetermined areas of the plate. These concave regions can either be formed simultaneously or successively.

For example, such a concave region can be shaped in one of the following shapes: dome-like, similar to a spherical calotte, tub-like, cup-like, trapezoidal cross-sectional shape, circular cross-sectional form. Also other shapes of the concave region are possible.

The dimension of each concave region can be controlled by the dimension of the area of the plate to which the negative pressure is applied. The greater this area is, the greater becomes the maximum diameter of the concave region. The dimension of the concave region can also be controlled by the magnitude of the negative pressure applied to the plate. The greater the negative pressure is, the greater becomes the height of the concave region.

Furthermore, the dimension of the concave region is controlled by thickness and material properties of the plate. The thicker and the stiffer is the plate, for example, the smaller become the height and diameter of the concave region at a given negative pressure applied to the plate.

According to an implementation of the method for encapsulating an OLED device, the plate is attached to a substrate. For example, parts of the plate are attached to parts of the substrate. The substrate comprises at least one active region. That means at least one active region is formed on the substrate. The substrate and the at least one active region form an OLED device.

The concave region of the plate spans over the active region on the substrate. That is to say that the concave region of the plate forms a cap which encapsulates the active region. The concave region thus protects the active region from mechanical damage for example. Furthermore, the plate is attached to the substrate in such a way that the plate encapsulates the active region as hermetically as possible. Hence the plate also acts as a protection against harmful atmospheric gases like oxygen or moisture.

In case a plurality of concave regions is formed on the plate, each concave region can span over at least one OLED device. Therefore, it is possible with the described method to encapsulate a plurality of OLED devices simultaneously.

In accordance with one implementation of the method, the plate is attached to the substrate after the concave region of the plate is formed. For example, the plate is attached to the substrate while the negative pressure is applied to the plate.

According to one implementation of the described method, at least one layer of material is applied to the plate. For example, the material can be applied to the plate by one of the following coating techniques: screen printing, doctor blading, vacuum deposition, sputtering.

In particular, the material can be applied to the side of the plate which faces the substrate. The material can be applied at least to a part of the concave region of the plate. For example the material can be applied to the plate before forming the concave region of the plate. In this case, the layer or layers of the material are flexible enough to ensure that the layers are not damaged while forming the concave region. After the concave region is formed the material attached to the plate curves with the same curvature as the pate.

In accordance with one implementation of the described method, the material comprises a getter material. In particular the getter material is applied to at least part of the concave region of the plate in such a way that the getter material faces the substrate. That means the getter material is applied to the plate and located between plate and substrate. For example, the getter material is applied in such a way to the plate that the getter material is formed over the active region without contacting the active region.

The getter material is selected to protect the active region of the device from harmful atmospheric gases or moisture. That means that the getter material is suited to chemically or physically bind these harmful substances.

According to one implementation of the method, the material comprises at least one of the following materials: Al, Ag, Zr, Ta, Mg, Ca, Ba, CaO, ziolite. These materials are especially suitable for protecting the active region against the mentioned harmful substances. Further, the material can comprise drying compounds such as barium oxide, calcium oxide or sodium oxide. These drying compounds are particularly well suited to protect the device against moisture.

In order to mechanically protect and to encapsulate the active region of the OLED device according to one implementation of the described encapsulation method, the plate comprises at least one of the following materials: metal, glass.

In accordance with one implementation of the method, a thickness of the plate between 0.05 and 0.4 mm is chosen. The thickness of the plate does not vary or varies only slightly over the whole plate. That means that the plate is of uniform thickness. The thickness of the plate is thereby particularly important. On the one hand, the plate has to be thick enough to provide adequate protection for the active region against mechanical damage. On the other hand, the plate has to be thin enough so that by applying a negative pressure to the plate a concave region can be formed, which is suited to encapsulate the active region of the OLED device. Due to the method for forming the concave region by applying negative pressure to the plate the thickness of the plate is not altered during the production of the encapsulation. That means the thickness of the plate stays e.g. uniform.

According to another implementation of the method, the plate is bonded to the substrate. The plate is bonded to the substrate by means of a bonding material. For example, the bonding material is applied between plate and substrate. The bonding material can, for example, be applied to sealing regions between plate and substrate where the plate is not concavely shaped.

The bonding material thereby fixes the plate to the substrate. Furthermore the bonding material can act as a barrier to harmful atmospheric gases like oxygen or moisture.

In order to enhance this protection effect the bonding material can comprise a getter material according to another implementation of the described method. Suitable getter materials are described above. The bonding material can also comprise at least one of the above described drying compounds.

Furthermore, according to an implementation of the encapsulation method, the bonding material comprises spacer particles. With the help of such spacer particles it is possible to set a predetermined distance between substrate and plate. For example, this distance between substrate and plate reduces the risk of damage of the active region by the plate. The spacer particles comprise a non-conductive material. The spacer particles can, for example, be cubic or spherical in shape. The average mean diameter of the spacer particles is between 5 and 10 µm.

According to another implementation of the method, the bonding material is thermally curable or curable by ultraviolet radiation. That is to say that the bonding material can be cured by applying heat or UV-radiation to the bonding material.

According to one implementation of the method, the bonding material is cured by applying electromagnetic radiation to the bonding material. For example, the electromagnetic radiation can be applied in a focussed way to the bonding material. That means that the electromagnetic radiation is focussed to be locally applied in regions where the bonding material is placed.

For example, the plate or substrate are transparent to said electromagnetic radiation. In this case the radiation can be directed through plate or substrate or—e.g. from two different directions—through both of them to the region where the bonding material is applied.

Alternatively to the usage of focussed electromagnetic radiation, the active region can be protected against the electromagnetic radiation by the usage of a shadow mask. In this case unfocussed electromagnetic radiation can be applied to the bonding material without the risk of harming the active region of the OLED device.

According to an implementation of the described method, the bonding material is cured by applying electromagnetic radiation in the infrared range to the bonding material. Radiation in the near infrared range is applied to the bonding material. For example, the near infrared radiation stimulates specific vibrations within the bonding material. Most of the energy of the radiation is then transferred to the bonding material for curing.

According to an implementation of the encapsulation method, the bonding material is cured by applying electromagnetic radiation in the ultraviolet range to the bonding material.

In accordance with an implementation of the method for encapsulating an OLED device, the bonding material comprises one of the following materials: epoxy adhesive, solder glass, silicon rubber.

According to an implementation of the method, the plate and substrate are pressed together during curing of the bonding material. That means that a force is applied to plate and substrate pressing plate and substrate together. The direction of the force is perpendicular to the plane of the interface of plate and substrate. Thereby it is possible that the force is uniformly applied over the whole area of the interface. It is also possible that a stronger force is applied to predetermined regions of the interface than to other regions. Thus, these regions are pressed together with greater force than other regions of the plate.

In accordance with an implementation of the described method, plate and substrate are pressed together by at least one weight. For example, the plate is placed on a carrier and the substrate is placed on the plate. Plate and substrate can then be pressed together by a weight applied to the side of the substrate which faces away from the plate.

According to an implementation of the method, the substrate comprises a plurality of OLED devices. Corresponding to each OLED device, a concave region is formed on the plate. The concave regions are formed on the plate in such a way that after attaching the plate to the substrate each concave region expands over one OLED device. That means that each OLED device can be encapsulated by exactly one concave region of the plate. For example, the concave regions of the plate are formed by applying a negative pressure to predetermined areas of the plate, before the substrate is attached to the plate. The plate and substrate are bonded by means of a bonding material. The bonding material is applied to sealing regions between substrate and plate where the plate shows no concave bending. Preferentially the negative pressure stays applied to the predetermined areas of the plate until the bonding material is cured.

According to an implementation of the method, in the region of each OLED device exactly one weight is applied to the surface of the substrate which faces away from the plate. These weights press the substrate to the plate, in particular in the regions of the OLED devices, and therefore enhance the bonding of substrate and plate in these regions. After curing of the bonding material the composite of substrate and plate can be separated into single OLED devices, each encapsulated by a concave region of the plate.

BRIEF DESCRIPTION OF THE DRAWINGS

FIG. 2a shows a schematic cross sectional view of an OLED device during a fabrication of an exemplary embodiment with the method for encapsulating an OLED device.

FIG. 2b shows a schematic top view corresponding to the sectional view depicted in FIG. 2a.

DETAILED DESCRIPTION OF THE DRAWINGS

Figure 1:
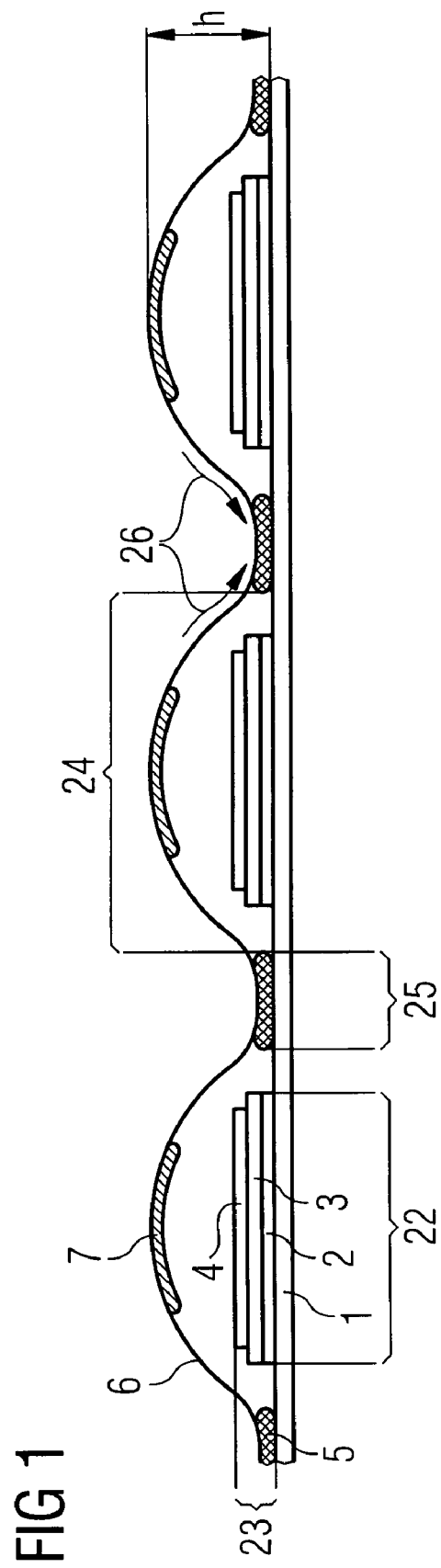
FIG. 1 shows a schematic cross sectional view of an exemplary embodiment of the encapsulated OLED device.

In the exemplary embodiments, identical or identically acting constituent parts are provided with identical reference symbols. In principle, the figures are not to be regarded as true to scale. In principle, the individual constituent parts are also not illustrated with the actual relative sizes with respect to each other.

FIG. 1 shows a schematic cross sectional view of an exemplary embodiment of an encapsulated OLED device.

Functional layers 2, 3, 4 of the OLED device 22 are formed on a substrate 1. The substrate 1 is, for example, given by a glass plate or a plate based on a polymeric plastic material. For example the substrate comprises at least one of the following materials: poly(ethylene terephthalate) (PET), poly(butylene terephthalate) (PBT), poly(enthylene naphthalate) (PEN), polycarbonate (PC), polyimides (PI), polysulfones (PSO), poly(p-phenylene ether sulfone) (PES), polyethylene (PE), polypropylene (PP), poly(vinyl chloride) (PVC), polystyrene (PS) and poly(methyl methyleacrylate) (PMMA).

In this embodiment the substrate 1 is flexible. The substrate 1 can be, for example, in the form of a foil.

The OLED device 22 further comprises a stack of one or more active layers 3 sandwiched between two electrodes 2, 4. The layer stack comprising electrodes 2, 4 and active layers 3 forms the active region 23 of the OLED device 22.

Since electromagnetic radiation produced in the OLED device 22 emerges through the substrate 1, the substrate 1 is transparent to at least part of the radiation produced in the active layer 3.

Electrical connections can be made to the electrodes 2, 4 via bond pads by bond wires not shown). When an electrical current is applied to the OLED device 22, electrons and holes are injected into the active layers 3 by the electrodes 2, 4. The thus injected charge carriers recombine within the active layers 3 and the released energy is emitted as electromagnetic radiation, e.g. as visible light.

Upper electrode 4 and lower electrode 2 can be patterned in stripes which are perpendicular to each other. At junctions of upper and lower electrodes 4, 2 radiation can be produced in the active layers 3. The junctions form a pixel matrix e.g. of a display device.

For example, the lower electrode 2 adjacent to the substrate 1 can act as an anode of the OLED device 22. The lower electrode 2 can form an electrical contact with ohmic characteristics to the active layers 3. If the lower electrode 2 acts as an anode it is able to inject holes into the active layer 3. In this embodiment, the lower electrode comprises a material which shows a high work function for electrons and a good transparency for the radiation emitted by active layers 3. For example the anode 2 comprises indium-tin-oxide (ITO).

The upper electrode 4 opposite the lower electrode 2 serves, for example, as a cathode for the OLED device 22. In order to minimize the injection barrier for electrons, upper electrode 4 preferably shows a low work function for electrons. For example, the upper electrode 4 comprises a metal or a compound material. The upper electrode 4 can comprise at least one of the following materials: Ca, Ba, Al, Ag. For example the upper electrode can be made of Ca or Ba. A layer (not shown) comprising Al or Ag can then be placed on the top of the upper electrode 4 in order to protect the upper electrode 4 against external influences like atmospheric gases and moisture and to guarantee a good electrical contact.

The active layer or layers 3 are placed between the lower and upper electrodes 2, 4. A stack of active layers 3 comprises, for example, one or more injection layers preferably adjacent to the lower electrode 2. These hole injection layers are suited to reduce the injection barrier for holes.

Further, the stack of active layers 3 may comprise one or more hole transportation layers, one or more electron transportation layers and at least one emission layer. As an emission layer, active organic materials can be used. For example, the emission layer comprises small organic molecules or an organic polymeric material. The emission layer can be fabricated by at least one of the following techniques: vacuum evaporation, deposition by solvent processes like doctor blading, spin coating or printing.

The OLED device 22 comprising the active region 23 and the substrate 1 is encapsulated by a plate 6. The plate 6 has a concave region 24. The concave region spans over the OLED device 22. For example, the concave region is dome-like, spherical calotte-like, tub-like or cup-like shaped.

The concave region 24 is produced by applying a negative pressure to a predetermined area of the plate 6. Thereby the concave region is produced to be extended enough not to contact the electrodes 2, 4 or the active layer 3. That means that the diameter and the height h of the concave region are great enough not to contact parts of the active region 23.

According to one embodiment of the OLED device, the plate 6 comprises at least one of the following materials: metal, glass. In order to facilitate the formation of a concave region by applying a negative pressure to the plate 6 and to make sure that the plate acts as a protection for the active region 23 against mechanical and chemical damage, the thickness of the plate can be between 0.05 and 0.4 mm.

Thereby the plate has a uniform thickness which means that the thickness of the plate does not vary or varies only slightly over the whole plate.

According to one embodiment of the OLED device, the plate 6 is bonded to the substrate 1 by means of a bonding material 5. The bonding material is located between concave regions 24 of the plate 6 at the interface of substrate 1 and plate 6 in the sealing regions 25. These sealing regions 25 surround the active region 23 of the OLED device 22.

The bonding material 5 in this embodiment is suited to seal the interface between substrate 1 and plate 6 as hermetically as possible. The bonding material 5 is suited to protect the OLED device 22 against external influences like atmospheric gases and moisture. Furthermore, the bonding material is able to withstand sheer stresses which the plate 6 can apply to the bonding material 5, for example along the directions presented by arrows 26. These sheer stresses are, for example, especially high when a mechanical force from outside the encapsulation is applied to the plate 6.

In accordance with one embodiment of the OLED device 22, the bonding material 5 is thermally curable or curable by electromagnetic radiation. The bonding material 5 comprises at least one of the following materials: epoxy adhesive, solder glass, silicon rubber.

In order to se a certain predetermined distance between substrate 1 and plate 6 in the sealing region 25 the bonding material 5 can further comprise spacer particles (not shown). The spacer particles comprise, for example, at least one of the following shapes: spherical, cubical, prism, pyramidal. Also, other regular or irregular shapes are possible. The average mean diameter of the spacer particles is, for example, between 5 μm and 10 μm, preferably 8 μm. The spacer particles comprise, for example, a non-conductive material like a glass or plastic material.

In accordance one embodiment of the encapsulation for the OLED device 22, a material 7 is applied to the plate 6. The material 7 can be applied to the plate by a coating technique like vacuum evaporation or printing to form at least one layer comprising the material. For example, the plate 6 is coated with material 7 by a screen printing process. At least part of the concave region 24 can be coated with this material 7. In particular, material 7 can be applied to a surface of the plate 6 facing the active region 23.

According to one embodiment of the OLED device 22, the material 7 comprises a getter material. The getter material 7 is suited to chemically or physically bind harmful atmospheric gases or moisture. For example, the getter material comprises at least one of the following materials: Al, Ag, Mg, Zr, Ta, Ca, Ba.

According to one embodiment of the OLED device 22, the bonding material 5 comprises a getter material 7.

FIG. 2a shows a schematic cross sectional view of an OLED device 22 during a fabrication step of an exemplary embodiment of the method for encapsulating an OLED device 22. The sectional views along the lines BB', CC' and DD' in FIG. 2b are merged into a single sectional view shown in FIG. 2a. FIG. 2b shows a schematic top view corresponding to the sectional view given in FIG. 2a.

On the right-hand side of the line AA' FIGS. 2a and 2b show the production step of the encapsulation method before applying a negative pressure to the plate 6. The left-hand side of FIGS. 2a, 2b shows a production step after applying negative pressure to the plate 6 where concave regions 24 are to be formed.

The apparatus for applying negative pressure to the plate 6 and for bonding the substrate 1 to the plate 6 comprises a base plate 11. The base plate 11 comprises channels 12 to exhaust the air from cavities 27 between base plate 11 and plate 6.

On the base plate 11 between base plate 11 and plate 6 a metal grid 13 is applied. For example the metal grid 13 is bonded to the base plate 11 by means of bonding material 16. The metal grid 13 is, for example, given by a metal plate with cut-outs 13a. For example these cut-outs 13a are produced by laser cutting. In order to prevent damage of the plate 6 applied to the metal grid 13 the metal grid 13 preferentially shows a smooth, e.g. polished surface.

When the air between base plate 11 and plate 6 is exhausted concave regions 24 of the plate 6 are produced in regions of the cut-outs 13a of the metal grid 13 (cf. FIG. 2a, left-hand side of line AA'). Those concave regions are produced due to the negative pressure in cavities 27 between base plate 11 and plate 6. Shape and dimension of cut-outs 13a define shape and dimension of cavities 27 and thus shape and dimension of the concave regions 24. The height h of the concave regions 24, that is to say the maximum distance between substrate 1 and plate 2 is mainly determined by properties of plate 6 like thickness or elasticity and by the amount of negative pressure applied to plate 6.

As becomes clear e.g. from FIG. 2a the height h of the concave region is also restricted by the thickness d of the metal grid 13. The greater the thickness d of the metal grid is chosen the greater can the height h of the concave region become—depending on the applied pressure. At a given thickness d of the metal grid 13 the shape of the concave region can be adjusted by the amount of negative pressure applied to the plate: the greater the negative pressure the less curved is the concave region since a greater area of the plate gets in contact with base plate 11. In this case e.g. a tub-like shaped concave region or a trapezoidal cross-sectional shape of the concave region can be produced.

The pressure in the cavity 27 can be chosen from 50 to 100 mbar below normal pressure. The greater the applied negative pressure is the greater becomes e.g. the height h of the concave region.

For example, the air between basic plate 11 and plate 6 can be exhausted by a vacuum pump 19 which is connected to a connection pin 17 via a tube 20. The resulting pressure can be monitored using a manometer 18.

When negative pressure is applied to plate 6 and concave regions 24 have been formed, the substrate 1 comprising active regions 23 is pressed to the plate 6. The substrate 1 is then bonded to plate 6 by means of a bonding material 5. Negative pressure is applied to plate 6 until bonding material 5 is cured. In order to facilitate the maintenance of negative pressure in the cavities 27 during curing a sealing cord 15 can be arranged around the metal grid 13, which prevents at least in part the intrusion of air from outside of the apparatus. The sealing cord 15 e.g. comprises polyurethane or perfluorelastomer.

For example, substrate 1 is pressed to plate 6 by means of weights 8. The weights 8 are loosely-fitted in cut-outs of a holding plate 10. The weights 8 can be lowered through these cut-outs in order to press the substrate 1 on the plate 6 and can be lifted after the bonding material 5 has been cured. For example a pressing plate 9 is applied to the surface of the weight 8 which faces the substrate. The pressing plate 9 distributes the force caused by the weight 8 to a greater area such that a more uniform pressure is applied to the substrate.

The bonding material 5 can be cured by means of a electromagnetic radiation 21, for example in the UV or near infrared range. In this case holding plate 10 and substrate 1 are radiation-permeable, at least for part of the radiation 21.

For example the radiation can be focussed to be applied mainly to the bonding material 5. If the radiation is applied in an unfocussed way, pressing plates 9 can act as shadow masks for the radiation 21. In this case pressing plates 9 are suited to absorb or reflect at least most part of the radiation 21 applied to them.

Substrate 1 is adjusted to plate 6 in such a way that concave regions 24 are formed to span over active regions 23. The holding plate 10 is adjusted to the substrate 1 so that weights 8 apply pressure to the substrate mainly in regions where active regions 23 are applied to the substrate. Holding plate 10 and substrate 1 can be adjusted by means of mechanical stop cylinders 14 which are arranged on the base plate 11. These stop cylinders 14 surround holding plate 10 and substrate 1.

The scope of the invention is not limited to the examples given hereinabove. For example the method for encapsulation is not limited to OLED devices. In particular it is furthermore suited for encapsulation of organic solar cells or organic photodetectors.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

We claim:

1. A method for encapsulating at least one organic light-emitting (OLED) device, comprising the steps of:
   preparing a substrate supporting at least one active region;
   forming a concave region on a plate by applying a pressure below atmospheric pressure on a side of the plate which faces away from the substrate; and
   attaching the plate to the substrate so that the concave region of the plate spans over the at least one active region.

2. The method according to claim 1, wherein the plate is coated with at least one layer of material.

3. The method according to claim 2, wherein the layer is applied to at least a part of the concave region of the plate.

4. The method according to claim 3, wherein the layer is applied to the plate before forming the concave region.

5. The method according to claim 2, wherein the layer comprises a chemical or physical getter material.

6. The method according to claim 2, wherein the layer comprises at least one of Al, Ag, Mg, Ca, Ba, Zr, Ta, CaO and zeolite.

7. The method according to claim 1, wherein the plate comprises at least one of metal and glass.

8. The method according to claim 1, wherein the plate is between 0.05 and 0.4 mm thick.

9. The method according to claim 1, wherein the plate is bonded to the substrate.

10. The method according to claim 9, wherein the plate is bonded to the substrate by means of a bonding material.

11. The method according to claim 10, wherein the bonding material is applied between plate and substrate.

12. The method according to claim 10, wherein the bonding material comprises a getter material.

13. The method according to claim 10, wherein the bonding material comprises spacer particles.

14. The method according to claim 10, wherein the bonding material is thermally or UV-curable.

15. The method according to claim 14, wherein during curing of the bonding material the plate and substrate are pressed together.

16. The method according to claim 15, wherein the plate and substrate are pressed together by at least one load.

17. The method according to claim 16, wherein the at least one load is applied to the surface of the substrate facing away from the active region such that the substrate is pressed on the plate.

18. The method according to claim 17, wherein for each OLED device a concave region is formed on the plate, each concave region spanning over exactly one OLED device.

19. The method according to claim 17, wherein in the region of each OLED device exactly one load is applied to the surface of the substrate facing away from the OLED device in order to press the substrate on the plate during curing of a bonding material which is applied between substrate and plate.

20. The method according to claim 10, wherein the bonding material is cured by applying electromagnetic radiation to the bonding material.

21. The method according to claim 20, wherein the electromagnetic radiation is focussed to be locally applied in regions where the bonding material is applied.

22. The method according to claim 20, wherein the bonding material is cured by applying electromagnetic radiation in the infrared range to the bonding material.

23. The method according to claim 20, wherein the bonding material is cured by applying electromagnetic radiation in the UV-range to the bonding material.

24. The method according to claim 10, wherein the bonding material comprises at least one of epoxy adhesive, solder glass and silicon rubber.

* * * * *